(12) United States Patent
Brennan et al.

(10) Patent No.: US 7,692,236 B1
(45) Date of Patent: Apr. 6, 2010

(54) MULTIPLE DUAL BIT MEMORY INTEGRATED CIRCUIT SYSTEM

(75) Inventors: Michael Brennan, Campbell, CA (US); Jaeyong Park, Sunnyvale, CA (US); Hidehiko Shiraiwa, San Jose, CA (US); Satoshi Torii, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/059,139

(22) Filed: Feb. 15, 2005

(51) Int. Cl.
*H01L 23/62* (2006.01)
(52) U.S. Cl. .................................. 257/324; 257/E21.21
(58) Field of Classification Search ................... 257/324, 257/E21.21
See application file for complete search history.

(56) References Cited

U.S. PATENT DOCUMENTS

| | | | | |
|---|---|---|---|---|
| 5,661,687 A | * | 8/1997 | Randazzo | ............... 365/185.24 |
| 5,903,034 A | * | 5/1999 | Sakamoto et al. | ............ 257/379 |
| 6,388,911 B1 | * | 5/2002 | Lee | ............................. 365/104 |
| 6,645,801 B1 | * | 11/2003 | Ramsbey et al. | ............ 438/216 |
| 2001/0055838 A1 | * | 12/2001 | Walker et al. | ................ 438/129 |
| 2002/0028541 A1 | * | 3/2002 | Lee et al. | ..................... 438/149 |
| 2004/0014290 A1 | * | 1/2004 | Yang et al. | .................. 438/288 |

* cited by examiner

*Primary Examiner*—Bradley K Smith
*Assistant Examiner*—Amar Movva
(74) *Attorney, Agent, or Firm*—Mikio Ishimaru

(57) ABSTRACT

A multiple dual bit integrated circuit system is provided that includes forming first address lines in a semiconductor substrate and forming a charge-trapping layer over the semiconductor substrate. A semiconductor layer is formed over the charge-trapping layer and second address lines are formed in the semiconductor layer to form a plurality of dual bit locations.

20 Claims, 4 Drawing Sheets

MULTIPLE DUAL BIT MEMORY INTEGRATED CIRCUIT SYSTEM

BACKGROUND OF THE INVENTION

1. Technical Field

The present invention relates generally to semiconductor technology and more specifically to flash memory.

2. Background Art

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lack erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing two bits (dual bits) to be stored in a single cell is known as a dual bit or "Mirror-Bit®" Flash memory has been developed. In this technology, a memory cell is essentially split into two identical (mirrored) parts, each of which is formulated for storing one of two independent bits. Each dual bit Flash memory cell, like a traditional Flash cell, has a gate with a source and a drain. However, unlike a traditional Flash cell in which the source is always connected to an electrical source and the drain is always connected to an electrical drain, each dual bit Flash memory cell can have the connections of the source and drain reversed during operation to permit the storing of two bits.

The dual bit Flash memory cell has a semiconductor substrate with implanted conductive bit lines. A charge storage layer is formed over the semiconductor substrate. Word lines are formed over the charge storage layer perpendicular to the bit lines and a dielectric layer is deposited.

As the widths of the bit lines and word lines reach the limits of manufacturability, the limits of data storage capability are also being reached and the data storage density apparently cannot be further increased.

A solution to this problem has been long sought but has long eluded those skilled in the art.

DISCLOSURE OF THE INVENTION

The present invention provides a multiple dual bit integrated circuit system that includes forming first address lines in a semiconductor substrate and forming a charge-trapping layer over the semiconductor substrate. A semiconductor layer is formed over the charge-trapping layer and second address lines are formed in the semiconductor layer to form a plurality of dual bit locations.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
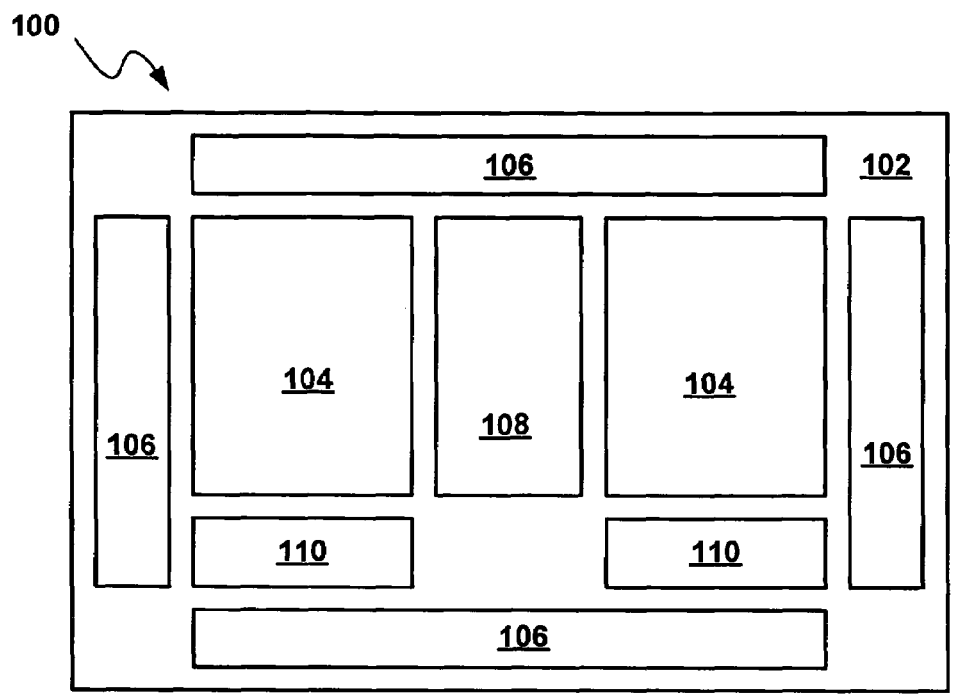
FIG. 1 is a plan view of a multiple dual bit memory integrated circuit system in accordance with an embodiment of the present invention.

In the following description, numerous specific details are given to provide a thorough understanding of the invention. However, it will be apparent to one skilled in the art that the invention may be practiced without these specific details. In order to avoid obscuring the present invention, some well-known circuits, system configurations, and processing steps are not disclosed in detail. Likewise, the drawings showing embodiments of the invention are semi-diagrammatic and not to scale and, particularly, some of the dimensions are for the clarity of presentation and are shown exaggerated in the FIGs.

In addition, where multiple embodiments are disclosed and described having some features in common, for clarity and ease of illustration, description, and comprehension thereof, similar and like features one to another will ordinarily be described with like reference numerals.

Referring now to FIG. 1, is a plan view of a multiple dual bit memory integrated circuit system 100 in accordance with an embodiment of the present invention. The multiple dual bit memory integrated circuit system 100 includes a semiconductor substrate 102 in which one or more high-density core regions and one or more low-density peripheral portions are formed. High-density core regions typically include one or more M×N array core regions 104 of individually addressable, substantially identical Flash memory cell systems.

Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is a plane parallel to the conventional plane or surface the semiconductor substrate 102 regardless of its orientation. The term "vertical" refers to a direction perpendicular to the horizontal as just defined. Terms, such as "above", "below", "higher", "lower", "over", "under", "side" and "beside", are relative to these horizontal and vertical planes. The term "on" as used with a layer being "on" another layer indicates contact between the layers regardless of whether the layers are horizontal or vertical. The term "processed" as used herein is defined to include one or more of the following: depositing or growing semiconductor materials, masking, patterning, photolithography, etching, implanting, removal, and/or stripping.

The term "dual bit locations" as used herein are locations where two bits of data are capable of being stored in a charge-trapping material on either side of a conductive region, which is not in the charge-trapping material, where the charges representing the data are capable of being independently written to or read.

Figure 2:
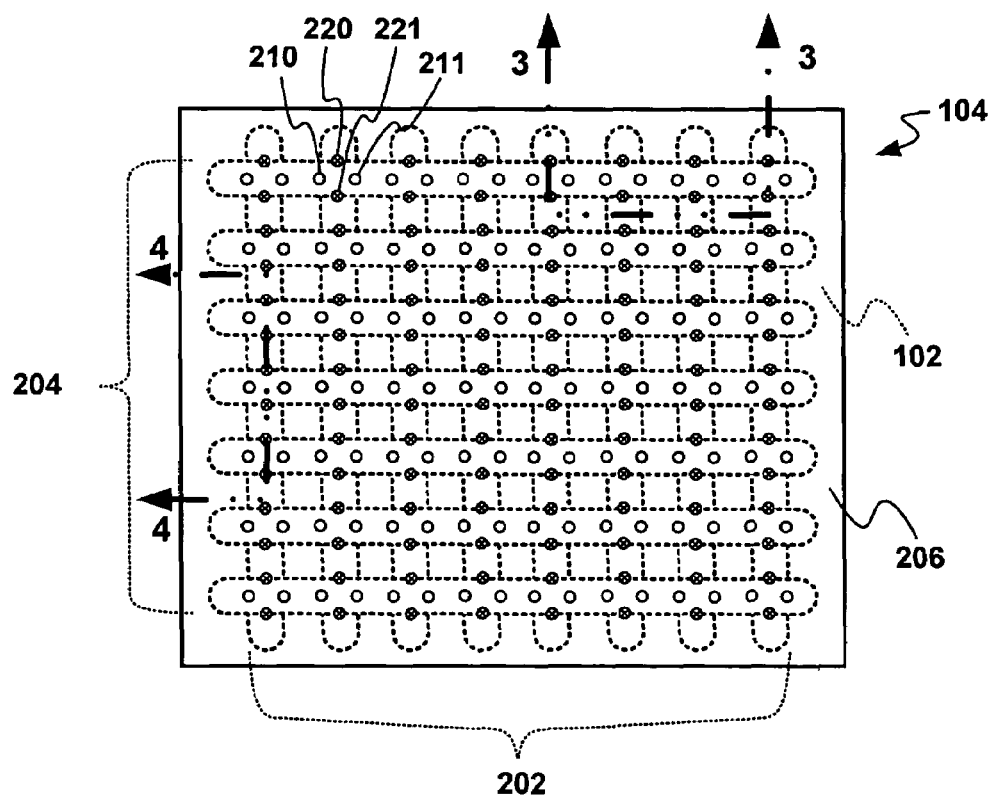
FIG. 2 is a plan view of a portion of one of the M×N array cores in accordance with the embodiment of the present invention of FIG. 1.

Referring now to FIG. 2, therein is shown a plan view of a portion of one of the M×N array core regions 104 in accordance with the embodiment of the present invention of FIG. 1. The semiconductor substrate 102 is of a semiconductor material such as single crystal silicon and may be lightly doped. The semiconductor substrate 102 has a plurality of conductive bit lines 202 extending in parallel with a plurality of conductive word lines 204 extending in parallel and at right angles to the plurality of conductive bit lines 202 in a semiconductor layer 206. The conductive bit lines 202 and word lines 204 have contacts and interconnections (not shown) to the programming circuitry represented in part by the x-decoders 108 and y-decoders 110 of FIG. 1. The terms "bit lines" and "word lines" are used as a matter of convenience since the bit lines can be used as word lines and the word lines as bit lines depending on the bits being read to or written from. The generic term "address lines" describes both bit and word lines.

In one embodiment, the semiconductor substrate 102 is of p-doped silicon, the conductive bit lines 202 are n-doped in the silicon, the semiconductor layer 206 is of p-doped single crystalline or polyamorphous silicon (polysilicon), and the conductive word lines 204 are n-doped in p-doped silicon. The p-doping can be performed using boron and the n-doping using arsenic.

In one embodiment of the present invention, it has been discovered that the doping of the word lines in silicon permits multiple additional bit locations. This means that storage density cannot only be increased, but it can be increased in multiples of the previously possible technology. The M×N array core regions 104 have dual bit locations 210 and 211 and further dual bit locations 220 and 221. Thus, the multiple dual bit memory integrated circuit system 100 has almost twice the memory capacity of previous memory systems. The actual total increase in storage density depends on the relative pitches of the word lines and bit lines.

Programming circuitry controls two bits per cell by applying a signal to the word line, which acts as a control gate, and changing bit line connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

Figure 3:
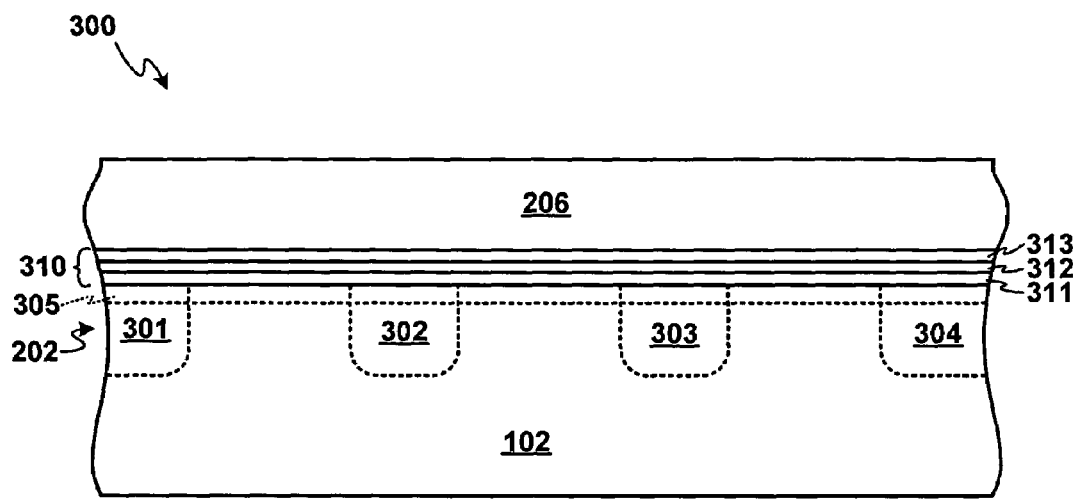
FIG. 3 is a cross-sectional view of a number of memory cells along line 3-3 in FIG. 2.

Referring now to FIG. 3, therein is shown a cross-sectional view of a number of memory cells 300 along line 3-3 in FIG. 2. The semiconductor substrate 102 has the plurality of conductive bit lines 202, such as the bit lines 301 through 304, which are implanted after the threshold adjustment implant 305. The threshold adjustment implant 305 provides a region that is more heavily doped than the semiconductor substrate 102 itself and assists in the control of the threshold voltage of the memory cells 300.

A charge-trapping dielectric layer 310 is deposited over the semiconductor substrate 102. The charge-trapping dielectric layer 310 can be a single layer or can be composed of three separate layers: a first insulating layer 311, a charge-trapping layer 312, and a second insulating layer 313. The first and second insulating layers 311 and 313 are of an oxide dielectric, such as silicon dioxide ($SiO_2$), and the charge-trapping layer 312 is of a nitride dielectric, such as silicon nitride ($Si_xN_y$). The oxide-nitride-oxide configuration is referred to as a matter of convenience as an "ONO layer".

In addition to an ONO layer memory stack, any charge storage memory stack could be used in alternate embodiments of the present invention.

The semiconductor layer 206 is formed over the charge-trapping dielectric layer 310. The semiconductor layer 206 is of a semiconductor material such as the semiconductor substrate material of single crystalline silicon, the gate material of polyamorphous silicon, etc. Where a single crystalline silicon layer is formed, processes used for forming silicon on dielectric structures are used such as separation by implantation of oxygen (SIMOX), wafer bonding, epitaxial growth of silicon by creating a seed hole in the ONO layer, etc.

Figure 4:
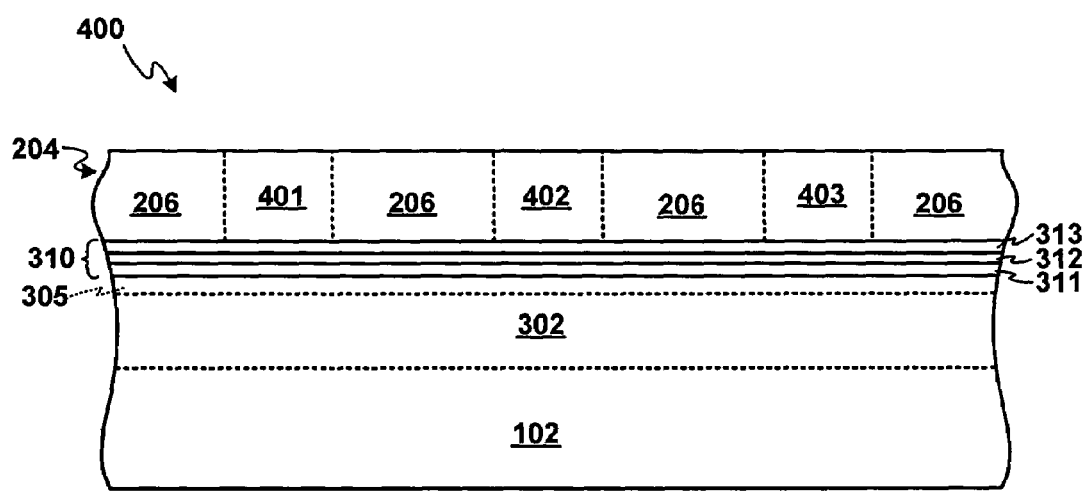
FIG. 4 is a cross-sectional view of a number of memory cells along line 4-4 in FIG. 2.

Referring now to FIG. 4, therein is shown a cross-sectional view of a number of memory cells 400 along line 4-4 in FIG. 2. The semiconductor layer 206 has a plurality of spaced apart implanted conductive word lines 204, such as the word lines 401 through 403, to form the multiple dual bit memory integrated circuit system of the present embodiment.

It has been discovered that for a given area, a larger storage density is obtainable. The larger storage density is achieved with a larger word line pitch. This is attractive from a fabrication perspective because it simplifies the manufacturing process. In addition, a storage density equivalent to a conventional arrangement may be obtained with fewer word lines and bit lines so the peripheral circuits can be reduced in size.

Further, the entire memory system can be scaled downward by conventional methods such as reducing word line and/or bit line width.

Figure 5:
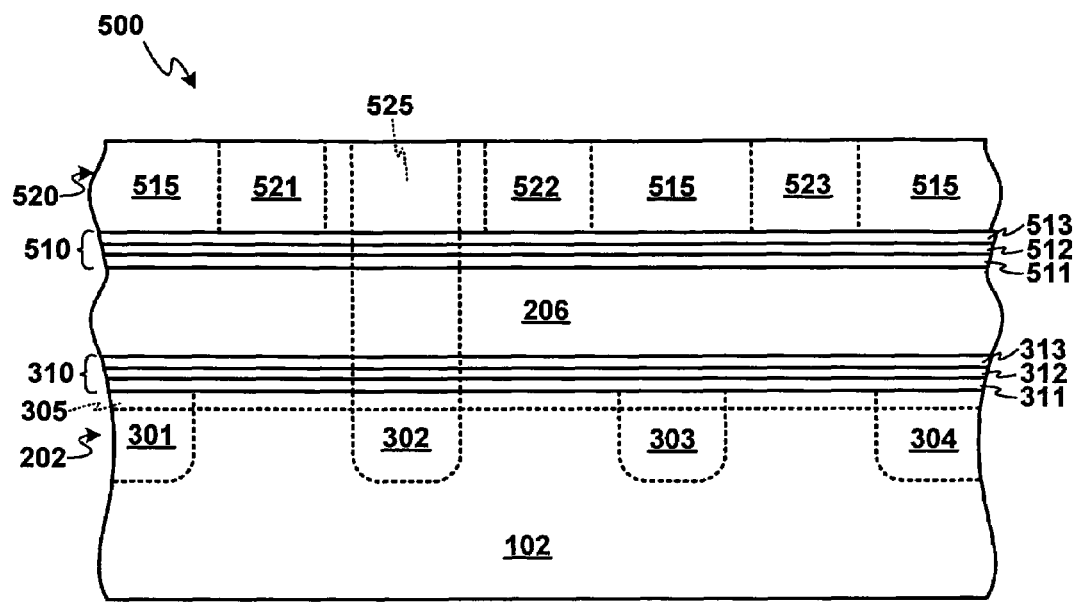
FIG. 5 is a cross-sectional view of a number of memory cells in accordance with another embodiment of the present invention similar to the cross-sectional view along line 3-3 in FIG. 2.

Referring now to FIG. 5, therein is shown a cross-sectional view of a number of memory cells 500 in accordance with another embodiment of the present invention similar to the cross-sectional view along line 3-3 in FIG. 2. The semiconductor substrate 102 has the plurality of conductive bit lines 202, such as the bit lines 301 through 304, which are implanted after the threshold adjustment implant 305. The threshold adjustment implant 305 provides a region that is more heavily doped than the semiconductor substrate 102 itself and assists in the control of the threshold voltage of the memory cells 500.

The charge-trapping dielectric layer 310 is deposited over the semiconductor substrate 102. The charge-trapping dielectric layer 310 has the first insulating layer 311, the charge-trapping layer 312, and the second insulating layer 313, which form the ONO layer.

In addition to an ONO layer memory stack, any charge storage memory stack could be used in alternate embodiments of the present invention.

The semiconductor layer 206 is formed over the charge-trapping dielectric layer 310.

A further charge-trapping dielectric layer 510 is deposited over the semiconductor substrate 102. The further charge-trapping dielectric layer 510 can also be composed of three separate layers: a first insulating layer 511, a charge-trapping layer 512, and a second insulating layer 513. The first and second insulating layers 511 and 513 are of an oxide dielectric, such as silicon dioxide ($SiO_2$), and the charge-trapping layer 512 is of a nitride dielectric, such as silicon nitride ($Si_xN_y$).

A further semiconductor layer 515 is formed over the charge-trapping dielectric layer 510. Where a crystalline silicon layer is formed, methods used for forming silicon on dielectric structures are used such as separation by implantation of oxygen (SIMOX), wafer bonding, epitaxial growth of silicon by creating a seed hole in the ONO layer, etc.

In a further embodiment, the further semiconductor layer 515 can be a semiconductor gate material such as polysilicon.

The further semiconductor layer 515 has a plurality of further conductive bit lines 520, such as bit lines 521 through 523. The bit lines 521 through 523 in one embodiment are of an implanted n-type material, such as arsenic, and can include an oxide portion (not shown) in other embodiments. The bit lines 521 through 523 are spaced apart and define a channel volume between them.

The further implanted bit lines 520 are offset from the implanted bit lines 202 to allow room for bit line contacts, such as the bit line contact 525. If bit line contacts are not required, the positioning of the further implanted bit lines 520 is not critical.

Figure 6:
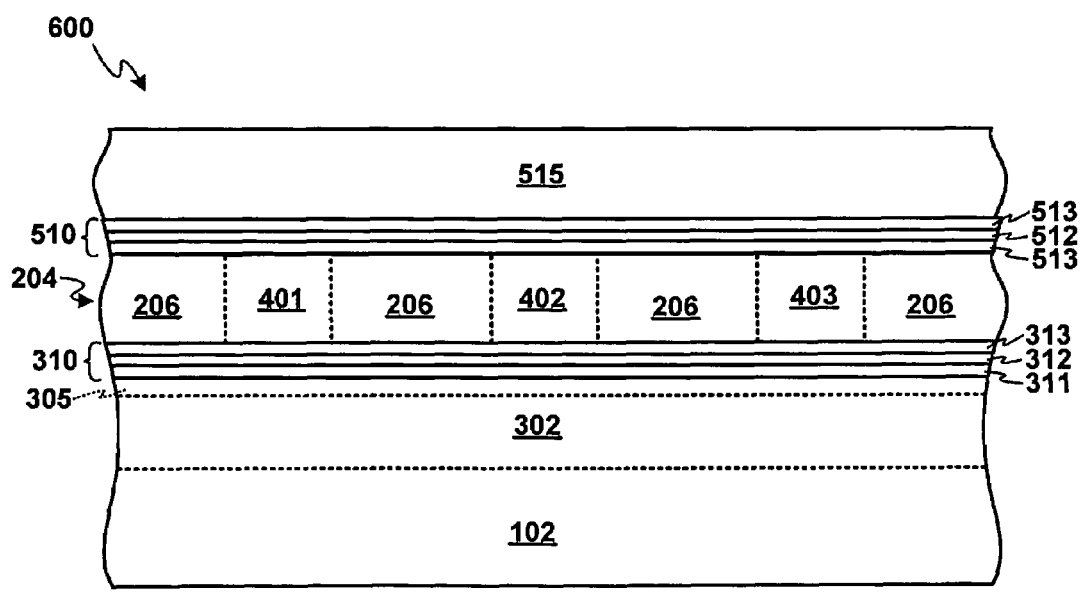
FIG. 6 is a cross-sectional view of a number of memory cells in accordance with a further embodiment of the present invention similar to the cross-sectional view along line 4-4 in FIG. 2.

Referring now to FIG. 6, therein is shown a cross-sectional view of a number of memory cells 600 in accordance with another embodiment of the present invention similar to the cross-sectional view along line 4-4 in FIG. 2. The semiconductor layer 206 has a plurality of implanted word lines 204, such as the word lines 401 through 403.

It has been discovered that the embodiment of the present invention described above will have a larger storage density for a given area, a larger storage density even with a larger word line pitch, a storage density equivalent to a conventional arrangement with fewer word lines and bit lines, and down sizing by reducing word line and/or bit line width. In addition, it has been discovered that additional storage density can be achieved by stacking even further layers of charge-trapping dielectric layers and silicon layers.

Figure 7:
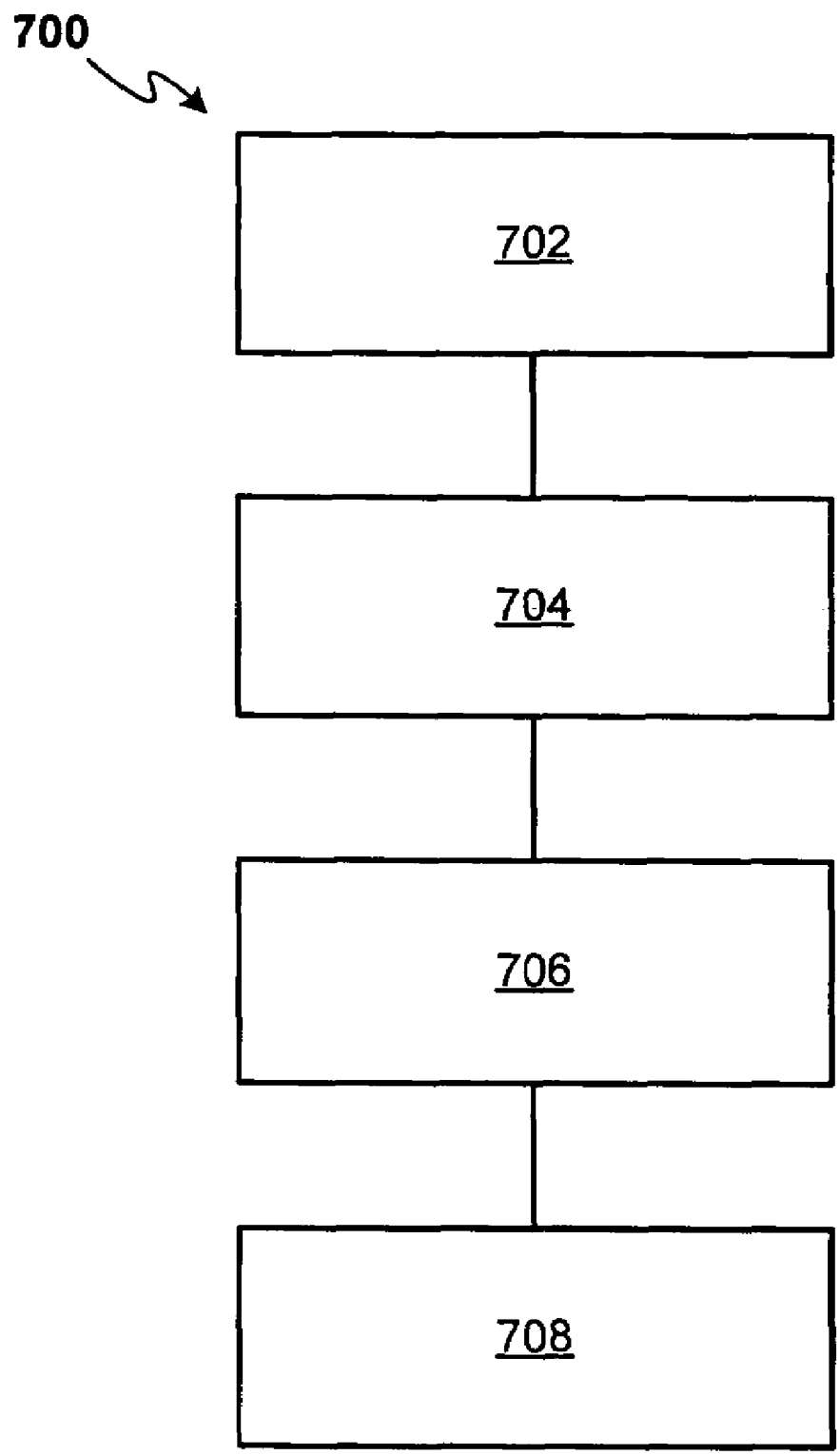
FIG. 7 is shown a multiple dual bit memory integrated circuit system for manufacturing an embodiment of the present invention.

Referring now to FIG. 7, therein is shown a multiple dual bit memory integrated circuit system 700 for manufacturing an embodiment of the present invention. Various alternative sequences, additions, and deletions to this process system would be obvious to those skilled in the art from a detailed reading of the present disclosure.

The multiple dual bit memory integrated circuit system 700 includes: forming first address lines in a semiconductor substrate in a block 702; forming a charge-trapping layer over the semiconductor substrate in a block 704; forming a semiconductor layer over the charge-trapping layer in a block 706; and forming second address lines in the semiconductor layer to form a plurality of dual bit locations in a block 708.

Different methods of forming the bit lines and word lines in semiconductor materials including using pre-doped silicon and diffusion of dopant from other materials can also be used without departing from the scope of the present invention.

Various implementations of the system may be used in different electronic devices, and especially the dual bit memory cell architecture may be achieved, according to one or more aspects of the present invention. In particular, the invention is applicable to memory devices wherein multiple bits in a multiple bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hither-to-fore set forth or shown in the accompanying drawings are to be interpreted in an illustrative and non-limiting sense.

The invention claimed is:

1. A multiple dual bit integrated circuit system comprising:
    forming first address lines in a semiconductor substrate;
    forming a charge-trapping layer on or over the semiconductor substrate;
    forming a semiconductor layer on or over the charge-trapping layer; and
    forming second address lines spaced apart in the semiconductor layer on the charge-trapping layer on and between the first address lines to form a plurality of dual bit locations.

2. The system as claimed in claim 1 wherein forming the semiconductor layer uses a silicon on dielectric forming process.

3. The system as claimed in claim 1 wherein forming the second address lines uses an implantation process.

4. The system as claimed in claim 1 further comprising:
    forming a further charge-trapping layer over the semiconductor layer;
    forming a further semiconductor layer over the further charge-trapping layer; and
    forming further address lines in the further semiconductor layer.

5. The system as claimed in claim 4 wherein forming the further address lines forms the further address lines offset from the first address lines in the semiconductor substrate.

6. A multiple dual bit integrated circuit system comprising:
    forming conductive bit lines in a first semiconductor material;
    forming a charge-trapping dielectric layer over the first semiconductor material;

forming a second semiconductor material over the charge-trapping dielectric layer; and forming conductive word lines spaced apart in the second semiconductor material on the charge-trapping dielectric layer on and between the conductive bit lines to form an array core region having a plurality of dual bit locations.

7. The system as claimed in claim 6 wherein forming the second semiconductor material uses a silicon on dielectric forming process or a polyamorphous silicon deposition process.

8. The system as claimed in claim 6 wherein forming the word lines uses an implantation process using the same dopant as the bit lines.

9. The system as claimed in claim 6 further comprising:
forming a further charge-trapping dielectric layer over the second semiconductor material;
forming a further semiconductor material over the further charge-trapping dielectric layer; and
forming further bit lines in the further semiconductor layer.

10. The system as claimed in claim 9 wherein:
forming the further bit lines forms the further bit lines offset from the bit lines in the first semiconductor material; and
further comprising:
forming contacts to the bit lines in the first semiconductor material.

11. A multiple dual bit integrated circuit system comprising:
a semiconductor substrate;
first address lines in the semiconductor substrate;
a charge-trapping layer over the semiconductor substrate;
a semiconductor layer on or over the charge-trapping layer; and
second address lines spaced apart in the semiconductor layer on the charge-trapping layer on and between the first address lines to form a plurality of dual bit locations.

12. The system as claimed in claim 11 wherein the semiconductor layer is single crystalline silicon.

13. The system as claimed in claim 11 wherein the second address lines are formed of dopants in silicon.

14. The system as claimed in claim 11 further comprising:
a further charge-trapping layer over the semiconductor layer;
a further semiconductor layer over the further charge-trapping layer; and
further address lines in the further semiconductor layer.

15. The system as claimed in claim 14 wherein the further address lines forms the further address lines offset from the first address lines in the semiconductor substrate.

16. A multiple dual bit integrated circuit system comprising:
conductive bit lines in a first semiconductor material;
a charge-trapping dielectric layer over the first semiconductor material;
a second semiconductor material over the charge-trapping dielectric layer; and
conductive word lines spaced apart in the second semiconductor material on the charge-trapping dielectric layer on and between the conductive bit lines to form an array core region having a plurality of dual bit locations.

17. The system as claimed in claim 16 wherein the second semiconductor material uses single crystalline silicon or polyamorphous silicon.

18. The system as claimed in claim 16 wherein the word lines and bit lines have the same dopant.

19. The system as claimed in claim 16 further comprising:
a further charge-trapping dielectric layer over the second semiconductor material;
a further semiconductor material over the further charge-trapping dielectric layer; and
further bit lines in the further semiconductor layer.

20. The system as claimed in claim 19 wherein:
the further bit lines are offset from the bit lines in the first semiconductor material; and
further comprising:
contacts to the bit lines in the first semiconductor material.

* * * * *